US012813203B2

(12) United States Patent
Kashiwagi

(10) Patent No.: US 12,813,203 B2
(45) Date of Patent: Nov. 24, 2026

(54) HEAD FOR HOLDING SUBSTRATE AND SUBSTRATE PROCESSING APPARATUS

(71) Applicant: EBARA CORPORATION, Tokyo (JP)

(72) Inventor: Makoto Kashiwagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 445 days.

(21) Appl. No.: 18/034,350

(22) PCT Filed: Jul. 20, 2021

(86) PCT No.: PCT/JP2021/027160
§ 371 (c)(1),
(2) Date: Apr. 27, 2023

(87) PCT Pub. No.: WO2022/091500
PCT Pub. Date: May 5, 2022

(65) Prior Publication Data

US 2024/0006204 A1 Jan. 4, 2024

(30) Foreign Application Priority Data

Oct. 30, 2020 (JP) ................................ 2020-182844

(51) Int. Cl.
*H10P 72/00* (2026.01)
*B24B 37/10* (2012.01)
(Continued)

(52) U.S. Cl.
CPC .......... *H10P 72/0472* (2026.01); *B24B 37/32* (2013.01); *H10P 52/00* (2026.01); *H10P 52/403* (2026.01)

(58) Field of Classification Search
None
See application file for complete search history.

(56) References Cited

U.S. PATENT DOCUMENTS 6,019,670 A 2/2000 Cheng et al.
6,077,385 A * 6/2000 Kimura .................. B24B 37/30 156/345.14

(Continued)

FOREIGN PATENT DOCUMENTS

JP 2001-179605 A 7/2001
JP 2002-198339 A 7/2001

(Continued)

OTHER PUBLICATIONS

Machine Generated English Translation of the BIB of JP2005011999 published Jan. 13, 2025 (Year: 2005).*

(Continued)

*Primary Examiner* — Sylvia Macarthur
(74) *Attorney, Agent, or Firm* — BakerHostetler

(57) ABSTRACT

Provided is a structure that reduces a risk of affecting a mounting mechanism of a retainer member when a substrate collides with the retainer member.

According to one embodiment, a head for holding a polygonal substrate is provided. The head includes a substrate support surface, a retainer member, and a retainer guide. The substrate support surface has a shape corresponding to a shape of the polygonal substrate. The retainer member is disposed outside each side of the substrate support surface. The retainer guide is configured to support the retainer member. The retainer member has an engaging surface extending in a direction perpendicular to the substrate support surface, and the engaging surface of the retainer member engages with the retainer guide.

8 Claims, 11 Drawing Sheets

(51) Int. Cl.

| | |
|---|---|
| ***B24B 37/32*** | (2012.01) |
| ***H10P 52/00*** | (2026.01) |
| ***H10P 52/40*** | (2026.01) |

(56) References Cited

U.S. PATENT DOCUMENTS

| | | | | |
|---|---|---|---|---|
| 6,251,215 | B1 | 6/2001 | Zuniga et al. | |
| 6,435,949 | B1 | 8/2002 | Katsuoka et al. | |
| 7,326,103 | B2 * | 2/2008 | Sakurai | B24B 47/22 451/21 |
| 10,486,284 | B2 * | 11/2019 | Togashi | B24B 37/32 |
| 2002/0081955 | A1 * | 6/2002 | Numoto | B24B 37/30 451/288 |
| 2002/0173256 | A1 | 11/2002 | Suwabe | |
| 2009/0111362 | A1 * | 4/2009 | Nabeya | B24B 37/32 451/64 |
| 2013/0196573 | A1 | 8/2013 | Fukushima et al. | |
| 2020/0039024 | A1 | 2/2020 | Kobayashi et al. | |
| 2020/0306924 | A1 | 10/2020 | Kobayashi et al. | |
| 2024/0006204 | A1 * | 1/2024 | Kashiwagi | B24B 37/32 |

FOREIGN PATENT DOCUMENTS

| | | | | | |
|---|---|---|---|---|---|
| JP | 2003-048149 | A | | 2/2003 | |
| JP | 2003-179015 | A | | 6/2003 | |
| JP | 2005-011999 | A | | 1/2005 | |
| JP | 2005088171 | A | * | 4/2005 | |
| JP | 2020-019115 | A | | 2/2020 | |
| KR | 2002-0084818 | A | | 11/2002 | |
| KR | 20070034790 | A | * | 3/2007 | H10P 72/0431 |
| KR | 2010-0092663 | A | | 8/2010 | |

OTHER PUBLICATIONS

Machine Generated English Translation of the Description of JP2005011999 published Jan. 13, 2025 (Year: 2005).*

Machine Generated English Translation of the Claims of JP2005011999 published Jan. 13, 2025 (Year: 2005).*

European Patent Application No. 21885622.7; Extended Search Report; dated Aug. 8, 2024; 8 pages.

International Patent Application No. PCT/JP2021/027160; Int'l Search Report dated Sep. 21, 2021; 2 pages.

* cited by examiner

HEAD FOR HOLDING SUBSTRATE AND SUBSTRATE PROCESSING APPARATUS

CROSS-REFERENCE TO RELATED APPLICATIONS

This application is a U.S. national phase application of International Patent Application No. PCT/JP2021/027160 filed Jul. 20, 2021, which claims priority to Japanese Application No. 2020-182844 filed Oct. 20, 2020, which are incorporated by reference in their entireties for any and all purposes.

TECHNICAL FIELD

The present application relates to a head for holding substrate and a substrate processing apparatus. This application claims priority from Japanese Patent Application No. 2020-182844 filed on Oct. 30, 2020. The entire disclosure including the descriptions, the claims, the drawings, and the abstracts in Japanese Patent Application No. 2020-182844 is herein incorporated by reference.

BACKGROUND ART

In production of a semiconductor device, a chemical mechanical polishing (CMP) apparatus is used for planarizing a surface of a substrate. The substrate used in the production of the semiconductor device has a circular-plate shape in many cases. There is also a growing demand for planarization when planarizing a surface of a quadrangle substrate of a Copper Clad Laminate substrate (CCL substrate), a Printed Circuit Board (PCB) substrate, a photomask substrate, a display panel, and the like, not limited to the semiconductor device. There is also a growing demand for planarizing a surface of a package substrate on which an electronic device such as the PCB substrate is arranged.

While a circular semiconductor substrate has a dimension determined by a standard (for example, the SEMI standard), the above-described quadrangle substrate of the Copper Clad Laminate substrate (CCL substrate), the Printed Circuit Board (PCB) substrate, the photomask substrate, the display panel, and the like has a dimension that is not determined by a standard and the like, thus possibly including substrates having various dimensions. In recent years, the dimension of the substrate tends to increase in terms of production efficiency for the device.

CITATION LIST

Patent Literature

PTL 1: Japanese Unexamined Patent Application Publication No. 2003-179015

PTL 2: U.S. Pat. No. 6,019,670

PTL 3: Japanese Unexamined Patent Application Publication No. 2020-019115

SUMMARY OF INVENTION

Technical Problem

When a quadrangle substrate is polished by CMP, the substrate held by a polishing head is pressed against a polishing pad supported on a polishing table, and the polishing head and the polishing table are rotated, thus polishing the substrate. For avoiding the substrate from jumping out of the polishing head during polishing, the substrate is held at a predetermined position inside the head by a retainer member, in some cases. During polishing, a side surface of the quadrangle substrate sometimes collides with the retainer member. Since a quadrangle substrate sometimes has a large dimension and a significant weight, when the substrate collides with the retainer member, a mounting mechanism of the retainer member is affected, in some cases. Therefore, one purpose of this application is to provide a structure that reduces a risk of affecting a mounting mechanism of a retainer member when a substrate collides with the retainer member.

Solution to Problem

According to one embodiment, a head for holding a polygonal substrate is provided. The head includes a substrate support surface, a retainer member, and a retainer guide. The substrate support surface has a shape corresponding to a shape of the polygonal substrate. The retainer member is disposed outside each side of the substrate support surface. The retainer guide is configured to support the retainer member. The retainer member has an engaging surface extending in a direction perpendicular to the substrate support surface, and the engaging surface of the retainer member engages with the retainer guide.

DESCRIPTION OF EMBODIMENTS

Figure 1:
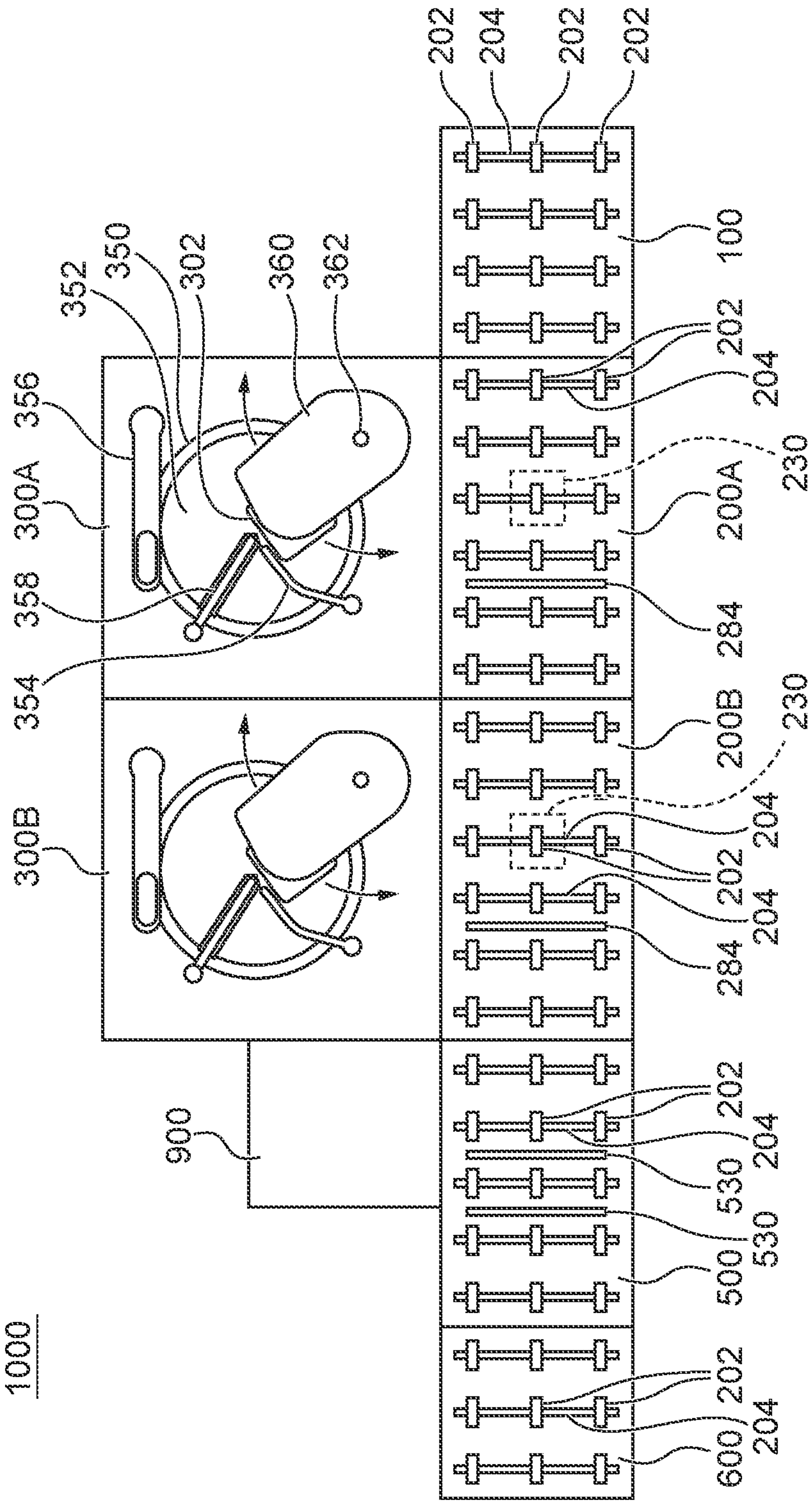
FIG. 1 is a plan view illustrating an overall configuration of a substrate processing apparatus according to one embodiment.

The following describes embodiments of a head and a substrate processing apparatus including the head according to the present invention with the attached drawings. In the attached drawings, identical or similar reference numerals are attached to identical or similar components, and overlapping description regarding the identical or similar components may be omitted in the description of the respective embodiments. Features illustrated in the respective embodiments are applicable to other embodiments in so far as they are consistent with one another.

FIG. 1 is a plan view illustrating an overall configuration of a substrate processing apparatus 1000 according to one embodiment. The substrate processing apparatus 1000 illustrated in FIG. 1 includes a load module 100, a transfer module 200, a polishing module 300, a drying module 500, and an unload module 600. In the illustrated embodiment, the transfer module 200 includes two transfer modules 200A, 200B, and the polishing module 300 includes two polishing modules 300A, 300B. In one embodiment, these respective modules can be independently formed. By independently forming these modules and conveniently combining the numbers of the respective modules, the substrate processing apparatus 1000 having different configuration can be easily formed. The substrate processing apparatus 1000 includes a control device 900, and each component of the substrate processing apparatus 1000 is controlled by the control device 900. In one embodiment, the control device 900 can be constituted from a general computer including an input/output device, an arithmetic device, a storage device, and the like.

<Load Module>

The load module 100 is a module for introducing a substrate WF on which processing such as polishing and cleaning has not been performed into the substrate processing apparatus 1000. In one embodiment, the load module 100 includes a plurality of transfer rollers 202 for transferring the substrate WF. The transfer roller 202 is mounted to a roller shaft 204. By rotating the transfer rollers 202 via the roller shaft 204, the substrate WF on the transfer rollers 202 can be transferred in a predetermined direction (in FIG. 1, the left direction). In one embodiment, the load module 100 may be configured to include an ID reader and read an ID of a received substrate. In one embodiment, the load module 100 may include a sensor for detecting presence/absence of the substrate WF at a predetermined position on the transfer rollers 202.

In the illustrated embodiment, a transfer mechanism of the load module 100 includes the plurality of transfer rollers 202 and the plurality of roller shafts 204 to which the transfer rollers 202 are mounted. In the embodiment illustrated in FIG. 1, three transfer rollers 202 are mounted to each roller shaft 204. The substrate WF is disposed on the transfer rollers 202, and the substrate WF is transferred by the transfer rollers 202 rotating. The mounting positions of the transfer rollers 202 on the roller shaft 204 can be conveniently set as long as they are positions where the substrate WF can be stably transferred. However, since the transfer rollers 202 are brought into contact with the substrate WF, the transfer rollers 202 should be disposed such that the transfer rollers 202 are brought into contact with the substrate WF to be processed in a region where there is no problem even if the transfer rollers 202 are brought into contact with it. In one embodiment, the transfer roller 202 of the load module 100 can be constituted of a conductive polymer. In one embodiment, the transfer rollers 202 are electrically grounded via the roller shafts 204 and the like. The purpose of this is to suppress the substrate WF from being electrically charged and damaged. In one embodiment, an ionizer (not illustrated) may be disposed to the load module 100 for suppressing electrical charging of the substrate WF.

<Transfer Module>

The substrate processing apparatus 1000 illustrated in FIG. 1 includes two transfer modules 200A, 200B. Since the two transfer modules 200A, 200B can have the same configuration, in the following, they will be collectively described as the transfer module 200.

The illustrated transfer module 200 includes the plurality of transfer rollers 202 for transferring the substrate WF. By rotating the transfer rollers 202, the substrate WF on the transfer rollers 202 can be transferred in a predetermined direction. The transfer roller 202 of the transfer module 200 may be formed of the conductive polymer or may be formed of non-conductive polymer. The transfer rollers 202 are mounted to the roller shafts 204 and are driven by a motor via a gear. In one embodiment, the transfer module 200 can include a sensor for detecting the presence/absence of the substrate WF at a predetermined position on the transfer rollers 202.

In one embodiment, the transfer module 200 can include a delivery mechanism that grips or releases the substrate on the transfer rollers 202 to the polishing module 300 or for receiving the substrate from the polishing module 300. The delivery mechanism can be a pusher 230 that lifts the substrate on the transfer rollers 202. As for the pusher 230, for example, a pusher similar to or resembling the pusher disclosed in Japanese Unexamined Patent Application Publication No. 2020-019115 can be utilized.

In one embodiment, the transfer module 200 includes a cleaning mechanism for cleaning the substrate moving on the transfer rollers 202. The cleaning mechanism can include a cleaning nozzle 284 injecting a cleaning liquid toward the substrate moving on the transfer rollers 202. As for the cleaning nozzle 284, for example, a cleaning nozzle similar to or resembling the cleaning nozzle disclosed in Japanese Unexamined Patent Application Publication No. 2020-019115 can be utilized.

<Polishing Module>

Figure 2:
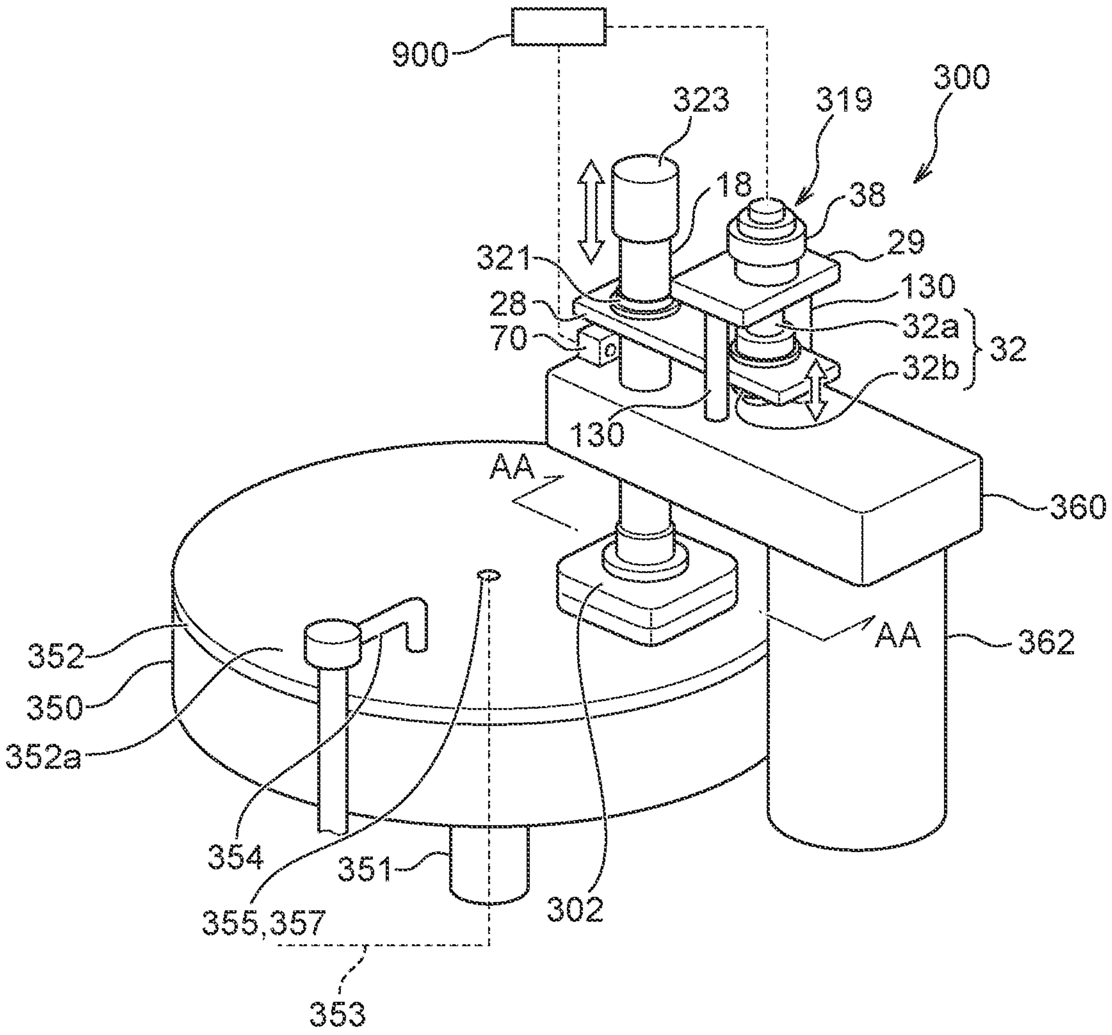
FIG. 2 is a perspective view schematically illustrating a configuration of a polishing module according to one embodiment.

FIG. 2 is a perspective view schematically illustrating a configuration of the polishing module 300 according to one embodiment. The substrate processing apparatus 1000 illustrated in FIG. 1 includes two polishing modules 300A, 300B. Since the two polishing modules 300A, 300B can have the same configuration, in the following, they will be collectively described as the polishing module 300.

As illustrated in FIG. 2, the polishing module 300 includes a polishing table 350 and a head 302 constituting a polishing head that holds the substrate as a polishing object and presses it against a polishing surface on the polishing table 350. The polishing table 350 is coupled to a polishing table rotation motor (not illustrated) arranged below it via a table shaft 351, thus being rotatable around the table shaft 351. The polishing table 350 has an upper surface on which a polishing pad 352 is stuck, and the polishing pad 352 has a surface 352*a* that constitutes the polishing surface that polishes the substrate. In one embodiment, the polishing pad 352 may be stuck via a layer for facilitating peeling from the polishing table 350. Such a layer is, for example, a silicone layer, a fluorine-based resin layer, and the like and, for example, one described in Japanese Unexamined Patent Application Publication No. 2014-176950 and the like may be used.

A polishing liquid supply nozzle 354 is installed above the polishing table 350, and this polishing liquid supply nozzle 354 supplies a polishing liquid onto the polishing pad 352 on the polishing table 350. As illustrated in FIG. 2, a passage 353 for supplying the polishing liquid is disposed through the polishing table 350 and the table shaft 351. The passage 353 communicate with an opening portion 355 on the surface of the polishing table 350. The polishing pad 352 has a through-hole 357 at a position corresponding to the opening portion 355 of the polishing table 350, and the polishing liquid passing through the passage 353 is supplied onto the surface of the polishing pad 352 from the opening portion 355 of the polishing table 350 and the through-hole 357 of the polishing pad 352. The numbers of the opening portion 355 of the polishing table 350 and the through-hole 357 of the polishing pad 352 may be each one or plural. The positions of the opening portion 355 of the polishing table 350 and the through-hole 357 of the polishing pad 352 may be any positions, but in one embodiment, they are arranged around the center of the polishing table 350.

Although not illustrated in FIG. 2, in one embodiment, the polishing module 300 includes an atomizer 358 for injecting a liquid or a mixture fluid of the liquid and a gas toward the polishing pad 352 (see FIG. 1). The liquid injected from the atomizer 358 is, for example, pure water, and the gas is, for example, a nitrogen gas.

The head 302 is connected to a head shaft 18, and this head shaft 18 moves up and down with respect to a swing arm 360 with an up-and-down motion mechanism 319. This up-and-down motion of the head shaft 18 moves the whole head 302 up and down and positions it with respect to the swing arm 360. The head shaft 18 rotates with driving of a head rotation motor (not illustrated). The rotation of the head shaft 18 rotates the head 302 centering on the head shaft 18. The head shaft 18 has an upper end to which a rotary joint 323 is mounted.

There are various kinds of polishing pad available in the market, for example, SUBA800 ("SUBA" is a registered trademark), IC-1000, and IC-1000/SUBA400 (two-layer cloth), manufactured by Nitta Haas Incorporated, and Surfin xxx-5, Surfin 000, and the like ("surfin" is a registered trademark) manufactured by FUJIMI INCORPORATED. SUBA800, Surfin xxx-5, and Surfin 000 are nonwoven fabrics obtained such that fiber is solidified with a urethane resin, and IC-1000 is a hard foamed polyurethane (single layer). The foamed polyurethane is porous and has a surface having multiple fine depressions or holes.

The head 302 has a lower surface configured to hold a quadrangle substrate. The swing arm 360 is configured to be turnable centering on a spindle 362. The head 302 is configured to be movable between a substrate delivery and receipt position of the above-described transfer module 200 and an upper side of the polishing table 350 with the turn of the swing arm 360. Moving down the head shaft 18 moves down the head 302 to allow the substrate to be pressed against the surface (the polishing surface) 352*a* of the polishing pad 352. At this time, the head 302 and the polishing table 350 are each rotated, and the polishing liquid is supplied onto the polishing pad 352 from the polishing liquid supply nozzle 354 disposed above the polishing table 350 and/or from the opening portion 355 disposed in the polishing table 350. Thus, the substrate can be pressed against the polishing surface 352*a* of the polishing pad 352 to polish a surface of the substrate. During polishing of the substrate WF, the swing arm 360 may be fixed or swung such that the head 302 passes through the center of the polishing pad 352 (covers the through-hole 357 of the polishing pad 352).

The up-and-down motion mechanism 319 moving the head shaft 18 and the head 302 up and down includes a bridge 28 that rotatably supports the head shaft 18 via a bearing 321, a ball screw 32 mounted to the bridge 28, a support table 29 supported by a support pillar 130, and an AC servo motor 38 disposed on the support table 29. The support table 29 supporting the servo motor 38 is fixed to the swing arm 360 via the support pillar 130.

The ball screw 32 includes a screw shaft 32*a* coupled to the servo motor 38 and a nut 32*b* with which the screw shaft 32*a* meshes. The head shaft 18 moves up and down integrally with the bridge 28. Accordingly, driving the servo motor 38 moves the bridge 28 up and down via the ball screw 32, and this moves the head shaft 18 and the head 302 up and down. The polishing module 300 includes a distance measuring sensor 70 as a position detector detecting a distance up to a lower surface of the bridge 28, namely, a position of the bridge 28. The position of the head 302 can be detected by detecting the position of the bridge 28 with this distance measuring sensor 70. The distance measuring sensor 70 constitutes the up-and-down motion mechanism 319 together with the ball screw 32 and the servo motor 38. The distance measuring sensor 70 may be a laser type sensor, an ultrasonic wave sensor, an overcurrent type sensor, or a linear scale type sensor. Each device inside the polishing module including the distance measuring sensor 70 and the servo motor 38 is configured to be controlled by the control device 900.

Figure 3:
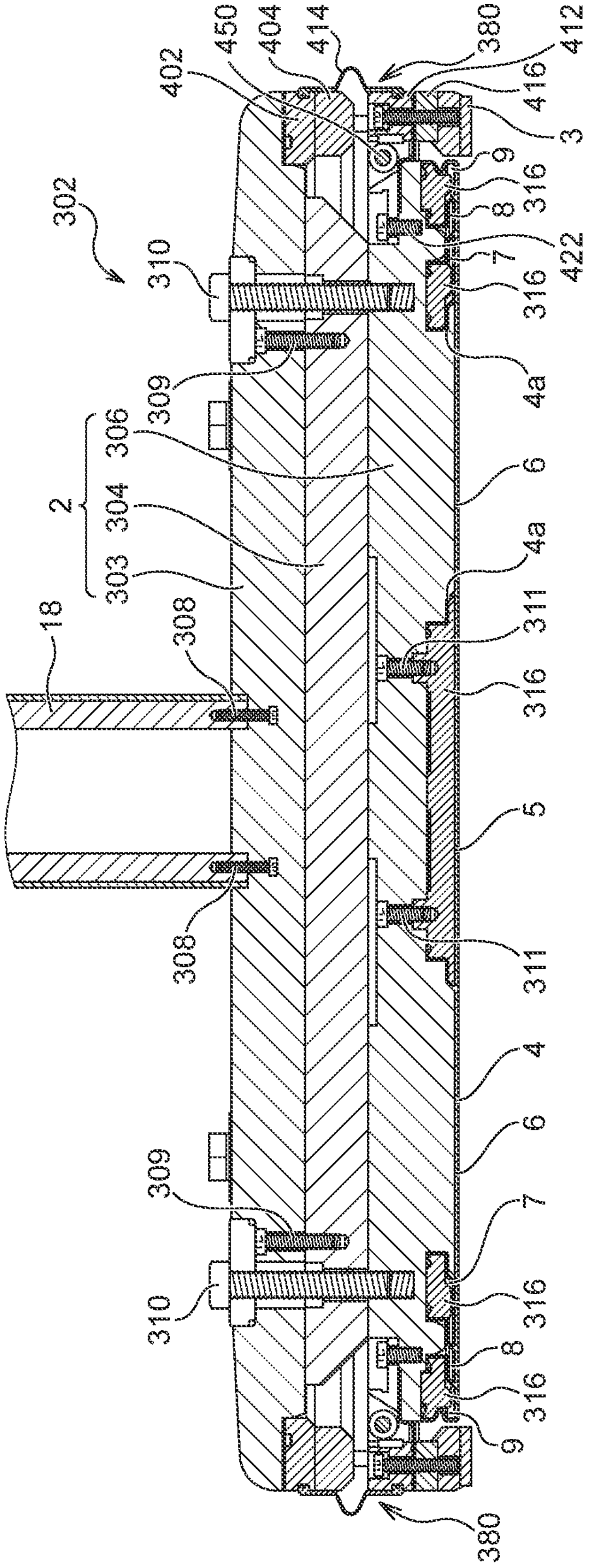
FIG. 3 is a cross-sectional view illustrating a detail structure of a head according to one embodiment.
Figure 4:
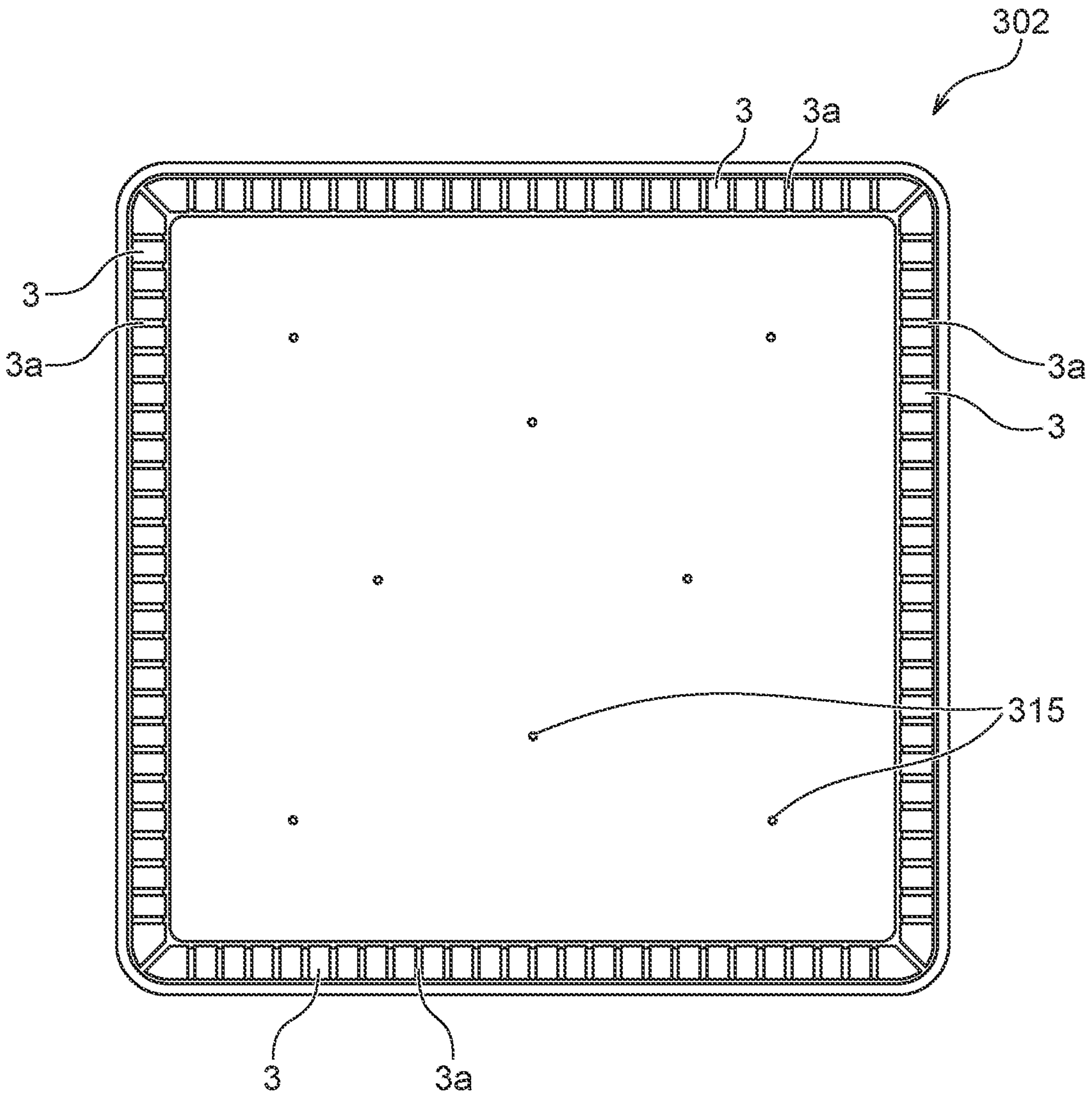
FIG. 4 is a drawing of the head viewed from a polishing table side according to one embodiment.

Next, the head 302 in the polishing module 300 according to one embodiment will be described. FIG. 3 is a cross-sectional view illustrating the detail structure of the head 302 according to one embodiment. FIG. 3 corresponds to a cross-sectional view in which the head 302 illustrated in FIG. 2 is cut out along arrows AA-AA. FIG. 4 is a drawing of the head 302 viewed from the polishing table 350 side, according to one embodiment.

In the embodiment illustrated in FIG. 3, the head 302 includes a head main body 2 and a retainer portion 380. The head main body 2 includes a quadrangle plate-shaped upper member 303, an intermediate member 304 mounted to a lower surface of the upper member 303, and a lower member 306 mounted to a lower surface of the intermediate member 304. The retainer portion 380 is mounted to an outer peripheral portion of the upper member 303. The upper member 303 is coupled to the head shaft 18 with bolts 308 and the like. The intermediate member 304 is coupled to the upper member 303 with bolts 309 and the like. The lower member 306 is coupled to the upper member 303 with bolts 310 and the like. The upper member 303, the intermediate member 304, and the lower member 306 can be formed of a metal material or a plastic material. In one embodiment, the upper member 303 is formed of stainless steel (SUS), and the intermediate member 304 and the lower member 306 are formed of a plastic material.

As illustrated in FIG. 3, the lower member 306 has a lower surface to which an elastic film 4 brought in contact with a back surface of the substrate WF is mounted. That is, the elastic film 4 constitutes a support surface supporting the substrate in the head 302. The support surface of the substrate with the elastic film 4 has a dimension the same as that of the substrate held by the head 302 or slightly larger than that of the substrate. As illustrated, this elastic film 4 is mounted to the lower surface of the lower member 306 with three concentric holders 316 (a thin cylindrical member in the center portion and two quadrangle ring-shaped members in a peripheral). The holders 316 are fixed to the lower member 306 with bolts 311 and the like, and the elastic film 4 can be mounted onto the lower surface of the lower member 306 by sandwiching the elastic film 4 with the holders 316 and the lower member 306. The elastic film 4 has a plurality of partitions formed by partition walls 4*a*. In one embodiment, the elastic film (membrane) 4 is formed of a rubber material having excellent strength and durability, such as ethylene propylene rubber (EPDM), polyurethane rubber, silicon rubber, or the like. In one embodiment, the elastic film (membrane) 4 can be formed from a rubber material using a mold.

As illustrated in FIG. 3, a center chamber 5, a ripple chamber 6, a middle chamber 7, an outer chamber 8, and an edge chamber 9 are defined by the elastic film 4 and the lower surface of the lower member 306. The center chamber 5, the ripple chamber 6, the middle chamber 7, the outer chamber 8, and the edge chamber 9 are each communicated with flow passages (not illustrated), and by supplying the fluid to the center chamber 5, the ripple chamber 6, the middle chamber 7, the outer chamber 8, and the edge chamber 9 via these flow passages, an internal pressure in each chamber 5, 6, 7, 8, and 9 can be independently controlled. Thus, when the substrate WF is polished, a contact pressure to the polishing pad 352 can be controlled for each area region of the substrate WF.

As illustrated in FIG. 4, a plurality of vacuum suction holes 315 for communicating with the ripple chamber 6 to cause the substrate WF to be vacuum-suctioned to the head 302 are formed in the elastic film 4. As one embodiment, as illustrated in FIG. 4, eight vacuum suction holes 315 are disposed. The vacuum suction holes 315 communicate with passages (not illustrated) and coupled to a vacuum source. The substrate WF can be vacuum-suctioned to the elastic film 4 of the head 302 via the vacuum suction holes 315.

Figure 5:
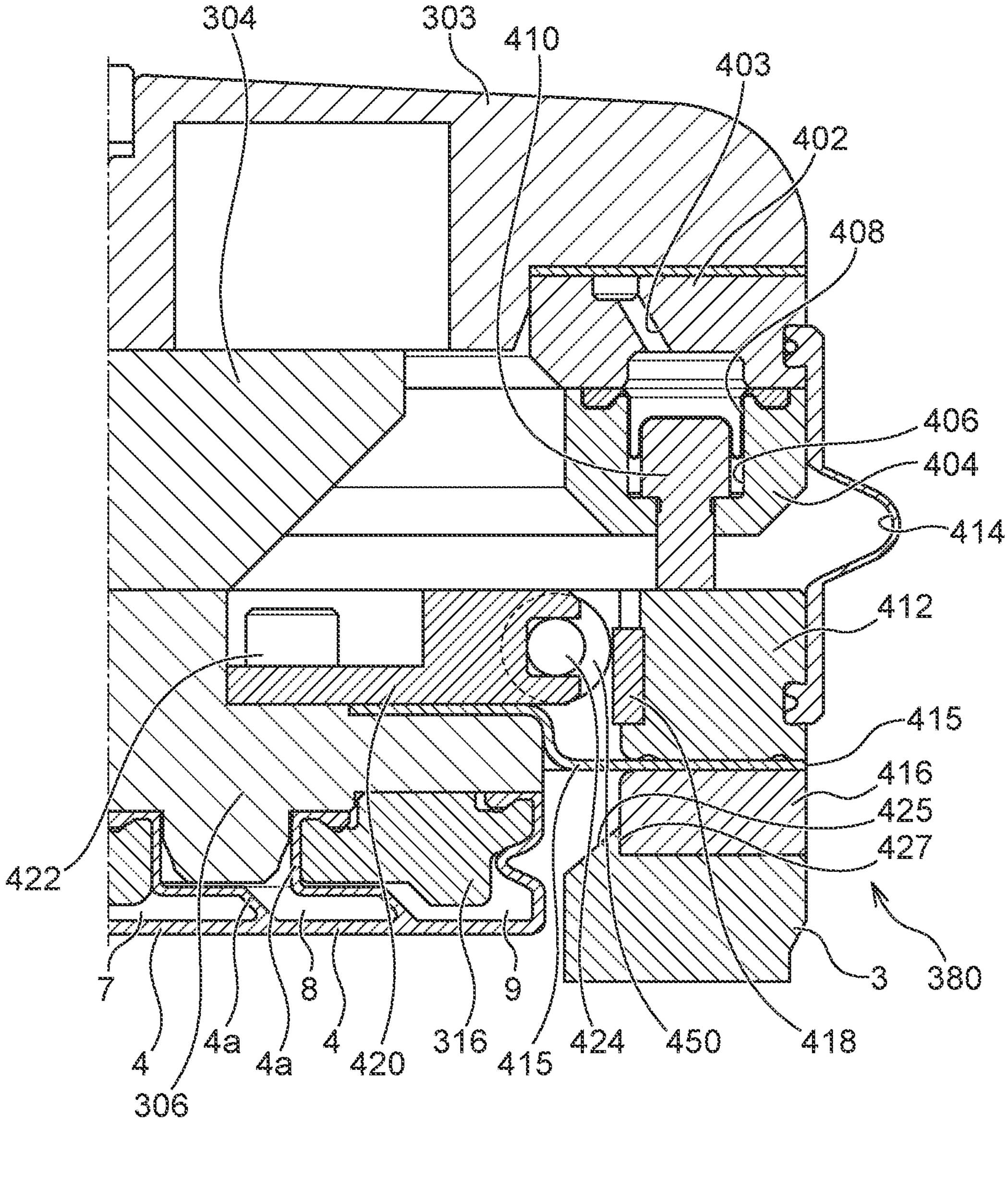
FIG. 5 is a cross-sectional view illustrating by enlarging a retainer portion in the cross-sectional view illustrated in FIG. 3.
Figure 6:
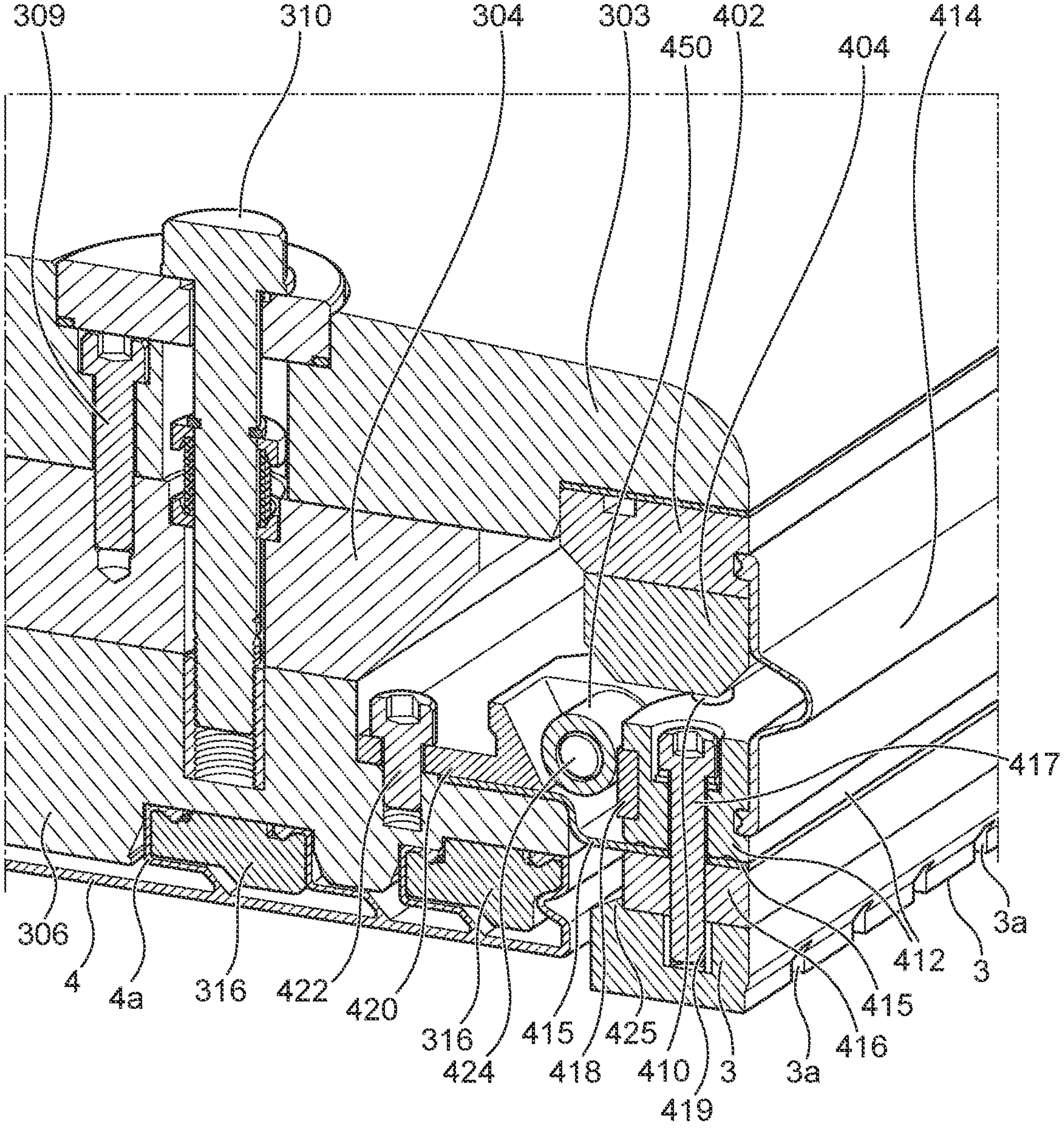
FIG. 6 is a perspective cross-sectional view illustrating by enlarging the retainer portion in the cross-sectional view illustrated in FIG. 3.

FIG. 5 is a cross-sectional view illustrating by enlarging the retainer portion 380 in the cross-sectional view illustrated in FIG. 3. FIG. 6 is a perspective cross-sectional view illustrating by enlarging the retainer portion 380 in the cross-sectional view illustrated in FIG. 3. As illustrated, the retainer portion 380 is disposed in an outer peripheral portion of the upper member 303. As illustrated, an upper housing 402 is coupled to a lower surface of the outer peripheral portion of the upper member 303. In one embodiment, the upper housing 402 can be fixed to the upper member 303 by a bolt or the like via a seal packing or the like. A lower housing 404 is included on a lower surface of the upper housing 402. In one embodiment, the upper housing 402 and the lower housing 404 are quadrangle ring-shaped members as a whole and can be formed of a polyphenylene sulfide (PPS) resin. A cylindrical cylinder 406 is defined inside the lower housing 404. A diaphragm 408 is disposed inside the cylinder 406. In one embodiment, the diaphragm 408 is formed of a rubber material. The diaphragm 408 is fixed by being sandwiched between the upper housing 402 and the lower housing 404. An internal space of the cylinder 406 is partitioned into an upper space and a lower space by the diaphragm 408. A piston 410 is disposed inside the diaphragm 408 in the lower housing 404. The piston 410 has one end that is brought into contact with a lower surface of the diaphragm 408. The piston 410 has another end that protrudes from a lower side of the lower housing 404 and is brought into contact with a retainer support guide 412. In one embodiment, the piston 410 can be formed of a PPS resin.

Figure 7:
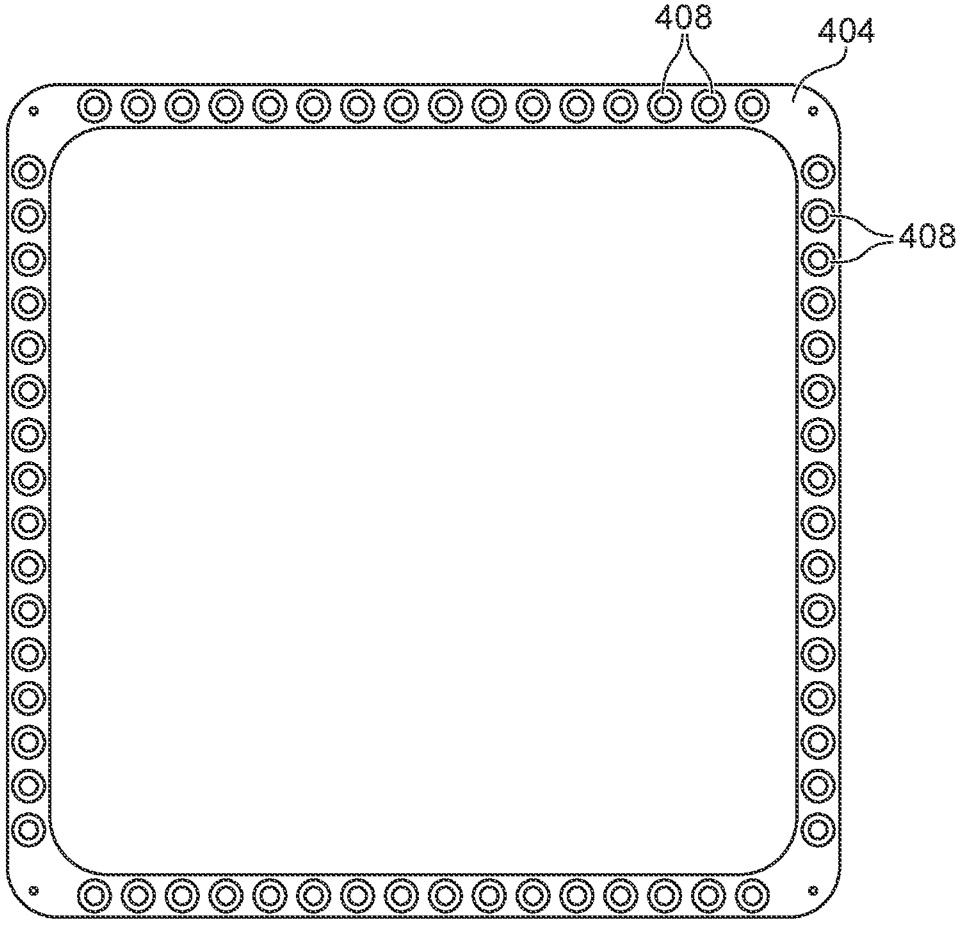
FIG. 7 is a plan view of a lower housing viewed from above according to one embodiment.

FIG. 7 is a plan view of the lower housing 404 viewed from above. In one embodiment, a plurality of cylinders 406 are formed in the lower housing 404, and the diaphragm 408 and the piston 410 are disposed in each cylinder 406. FIG. 7 illustrates the plurality of cylinders 406 formed in the lower housing 404 and the diaphragm 408 disposed in each cylinder 406. As illustrated, using the cylinders 406, the diaphragms 408, and the pistons 410 in which each of them has the same shape allows reducing cost for manufacturing them. For example, the diaphragm 408 and the piston 410, which are the same parts, can be used even when the head main bodies 2 having different dimensions are manufactured, and it is possible to design such that the number of parts to be used is changed depending on the size of the head main body 2.

A passage 403 is disposed in the upper housing 402. The passage 403 is connected to a fluid source. By passing through the passage 403, a fluid (for example, air or nitrogen) can be supplied into the upper space of the cylinder 406 of the lower housing 404 from the fluid source. When a fluid is supplied into the upper space of the cylinder 406, the diaphragm 408 bulges downward to move the piston 410 downward. Downward movement of the piston 410 allows moving the retainer support guide 412 downward.

In one embodiment, as indicated in FIG. 5, FIG. 6, a band 414 is mounted from an outer side surface of the upper housing 402 up to an outer side surface of the retainer support guide 412. The band 414 not only permits displacement of the retainer support guide 412 relative to the lower housing 404 but also suppresses the polishing liquid from entering a space between the lower housing 404 and the retainer support guide 412.

As illustrated, a retainer guide 416 is mounted onto a lower surface of the retainer support guide 412. In one embodiment, as illustrated, a seal packing 415 made of a rubber material or the like is disposed between the retainer support guide 412 and the retainer guide 416. As illustrated, a retainer member 3 is mounted onto a lower surface of the retainer guide 416. As indicated in FIG. 6, the retainer support guide 412, the retainer guide 416, and the retainer member 3 can be fixed by bolts 417. The retainer support guide 412 and the retainer guide 416 are quadrangle ring-shaped members as a whole. In one embodiment, the retainer support guide 412 and the retainer guide 416 are formed of stainless steel (SUS), and the retainer member 3 is formed of stainless steel (SUS), ceramic, a PPS resin, a polyvinyl chloride resin, or the like. As described above, by the retainer support guide 412 being moved downward by the piston 410 inside the lower housing 404, the retainer member 3 is moved downward.

In one embodiment, as indicated in FIG. 4, the retainer member 3 is an elongate rectangular plate-shaped member. In the embodiment illustrated in FIG. 4, as the retainer members 3, four plate-shaped members are disposed outside respective sides of the quadrangle head main body 2. As illustrated, the retainer members 3 are disposed outside respective sides of the quadrangle support surface corresponding to the shape of the quadrangle substrate. In the illustrated embodiment, end portions of the elongate retainer member 3 have circular sectors. Therefore, as illustrated in FIG. 4, combining four retainer members 3 allows surrounding approximately the whole including corner portions of the head main body 2 with the retainer members 3. In one embodiment, as illustrated in FIG. 4, the retainer member 3 includes a plurality of grooves 3*a*. In the retainer member 3 illustrated in FIG. 4 has the grooves 3*a* extending from inside to outside of the head 302. The groove 3*a* constitutes a passage through which the polishing liquid of slurry or the like passes during polishing. The sizes and the number of the grooves 3*a* are conveniently set, or the groove 3*a* may be omitted.

Figure 8:
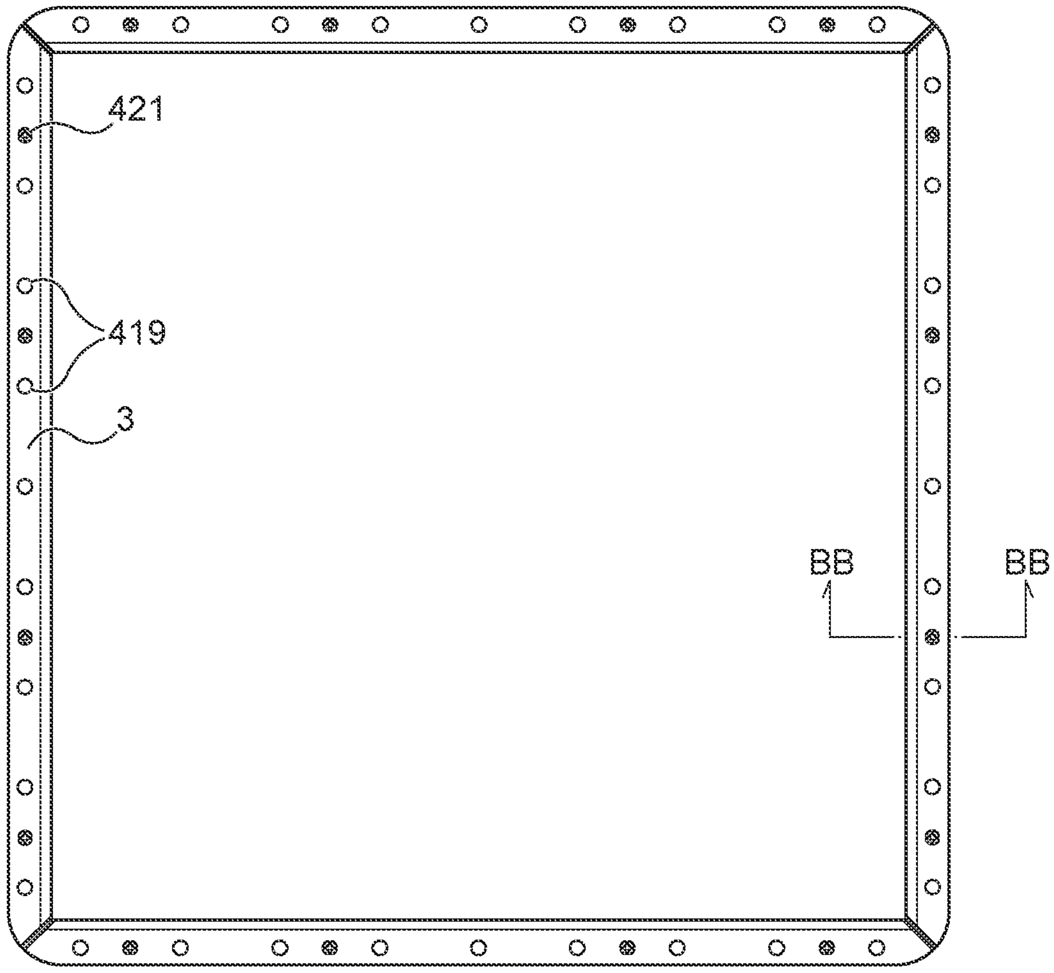
FIG. 8 is a schematic view of retainer members viewed from above (a retainer guide side) according to one embodiment.
Figure 9:
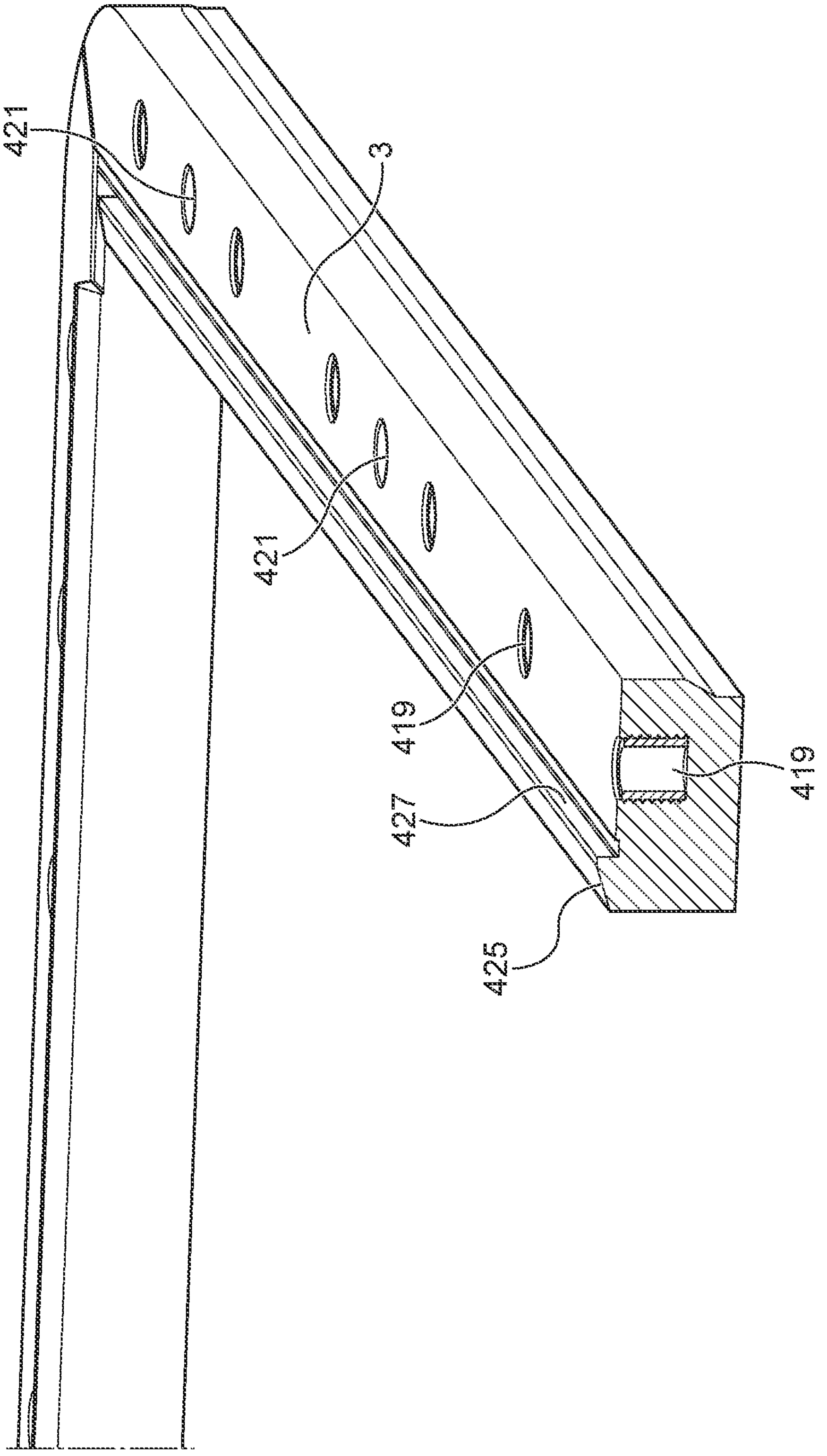
FIG. 9 is a partial cross-sectional view of a single body of the retainer members illustrated in FIG. 8.
Figure 10:
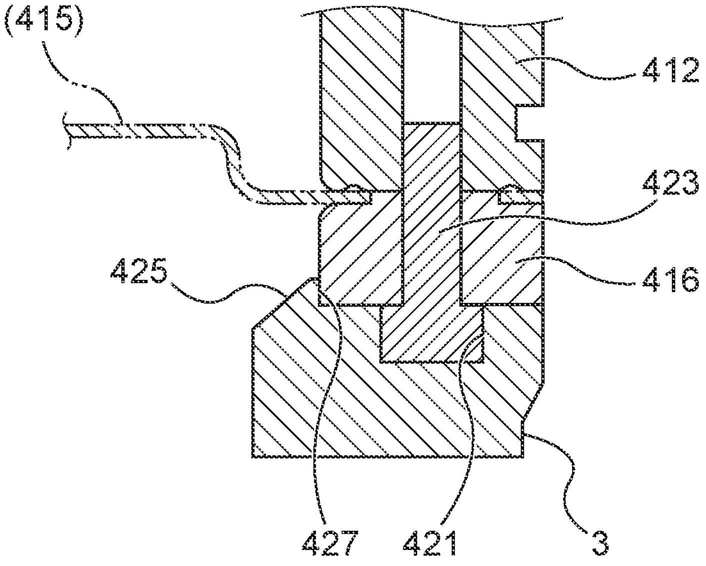
FIG. 10 is a partial cross-sectional view viewed from a direction of arrows BB-BB indicated in FIG. 8.

FIG. 8 is a schematic view of the retainer members 3 viewed from above (retainer guide 416 side) according to one embodiment. FIG. 9 is a partial cross-sectional view of a single body of the retainer members 3 illustrated in FIG. 8. As illustrated, to each of the four plate-shaped retainer members 3, bolt holes 419, into which the bolts 417 for fixing the retainer members 3 to the retainer support guide 412 and the retainer guide 416 are inserted, are disposed. As illustrated in FIG. 8, in the retainer member 3, pin holes 421 for arranging positioning pins 423 used for positioning the retainer member 3 to the retainer support guide 412 and the retainer guide 416 are disposed. FIG. 10 is a partial cross-sectional view viewed from a direction of arrows BB-BB illustrated in FIG. 8. In one embodiment, the pin hole 421 and the positioning pin 423 may be omitted.

In one embodiment, as illustrated in FIG. 5, FIG. 9, and FIG. 10, the retainer member 3 includes a projecting portion 425 projecting in a direction toward the retainer guide 416. Alternatively, it can be said that the projecting portion 425 of the retainer member 3 projects in a direction perpendicular to the plate surface of the plate-shaped retainer member 3. The projecting portion 425 of the retainer member 3 include an engaging surface 427 in contact with a side surface of the retainer guide 416. The engaging surface 427 of the retainer member 3 is constituted so as to face the direction of the retainer guide 416. In other words, the engaging surface 427 of the retainer member 3 is constituted so as to face away from the center of the head 302. Alternatively, it can also be said that the engaging surface 427 extends in a direction perpendicular to the substrate or the surface supporting the substrate. The engaging surface 427 of the retainer member 3 is constituted such that the engaging surface 427 is brought into contact with an inner side surface of the retainer guide 416 viewed from the center of the head 302 when the retainer member 3 is fixed to the retainer support guide 412 and the retainer guide 416.

As illustrated in FIG. 8, FIG. 9, the projecting portion 425 and the engaging surface 427 of the retainer member 3 are disposed approximately across the whole in a length direction of the plate-shaped retainer member 3. It is desirable that the projecting portion 425 and the engaging surface 427 of the retainer member 3 are disposed up to an end of the retainer member 3 with respect to the bolt hole 419 located at the farthest end.

When a substrate is polished, with the substrate being held under the elastic film 4 of the head 302 and being pressed against the polishing surface on the polishing table 350, the head 302 and the polishing table 350 are rotated. The retainer member 3 restricts motion in a lateral direction of the substrate under polishing relative to the head 302 during polishing such that the substrate does not jump out of the head 302 in the lateral direction during polishing. Since the head 302 and the polishing table 350 rotate during polishing of the substrate, the side surface of the substrate collides with the retainer member 3. When the substrate collides with the retainer member 3, a lateral force is applied to the retainer member 3. Since the retainer member 3 according to the above-described embodiment includes the engaging surface 427 configured to be brought into contact with the retainer guide 416, the lateral force applied to the retainer member 3 is transmitted to the retainer guide 416 from the engaging surface 427. If the engaging surface 427 like the one described above does not present in the retainer member 3, the lateral force applied to the retainer member 3 would be transmitted to the retainer guide 416 through the bolts 417. In that case, a large force is applied to the bolts 417, and it is likely to cause the bolts 417 to be loosened. However, in the retainer member 3 according to the embodiment of this disclosure, since the lateral force applied to the retainer member 3 is transmitted to the retainer guide 416 from the engaging surface 427, the force transmitted to the bolts 417 can be reduced. Therefore, in the above-described embodiment, a risk of the bolts 417 being loosened can be reduced.

In the illustrated embodiment, while the retainer member 3 includes the engaging surface 427 that is brought into contact with the inner side surface of the retainer guide 416, other structures may be employed as long as the lateral force applied to the retainer member 3 can be transmitted by a surface to the retainer guide 416. For example, when the retainer member 3 includes a projecting portion and the retainer guide 416 includes a depressed portion corresponding to the projecting portion of the retainer member 3, a similar effect can be expected because the force can be transmitted by an uneven engaging surface. The retainer member 3 may include a depressed portion, and the retainer guide 416 may include a projecting portion.

Figure 11:
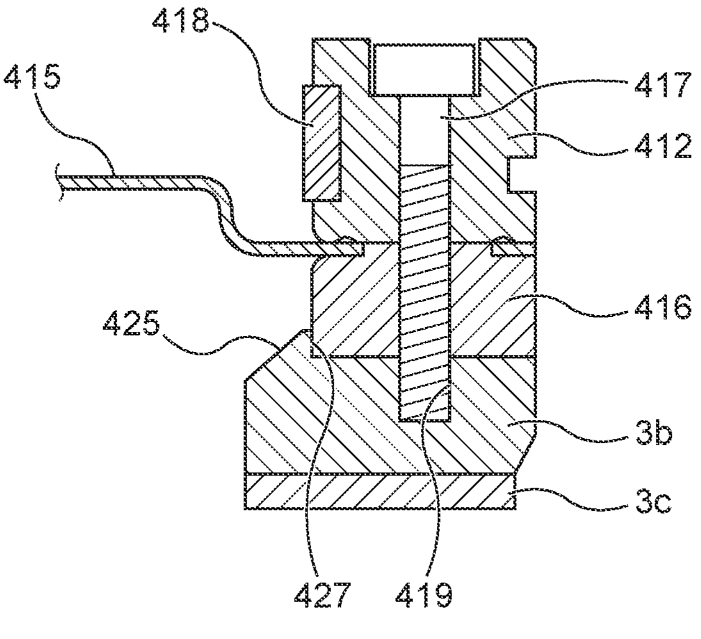
FIG. 11 is a cross-sectional view illustrating a retainer portion according to one embodiment.

FIG. 11 is a cross-sectional view illustrating the retainer portion 380 according to one embodiment. The retainer member illustrated in FIG. 11 includes a first layer 3*b* and a second layer 3*c*. The first layer 3*b* and the second layer 3*c* of the retainer member 3 can be made of different materials with one another. As described above, while the retainer member 3 can be formed of stainless steel (SUS), ceramic, a PPS resin, a polyvinyl chloride resin, or the like, for example, the first layer 3*b* can be formed of high rigidity stainless steel (SUS) or the like, and the second layer 3*c* can be formed of a PPS resin. Alternatively, the second layer 3*c* may be formed of a ceramic having a rigidity higher than a resin. The first layer 3*b* and the second layer 3*c* of the retainer member 3 can be adhered with one another with an adhesive such as an epoxy resin. Formation may be performed such that an uneven structure is disposed on a bonding surface between the first layer 3*b* and the second layer 3*c* of the retainer member 3 to be strengthened against an impact in the lateral direction.

In one embodiment, the head 302 includes a retainer guide device that guides the retainer member 3 so as to be displaceable in an up-down direction and supports the retainer member 3 so as to inhibit lateral displacement of the retainer member 3. In one embodiment, as illustrated in FIG. 5, FIG. 6, the retainer support guide 412, the retainer guide 416, and the retainer member 3 are supported and guided by a support roller 450 to be movable in the up-down direction. As illustrated, a support pad 418 is fixed on an inner side surface of the retainer support guide 412. As illustrated, in a state where the support pad 418 fixed to the retainer support guide 412 is brought into contact with and supported by the support roller 450, the retainer support guide 412, the retainer guide 416, and the retainer member 3 move in the up-down direction. In one embodiment, a slight gap can be constituted between the support pad 418 fixed to the retainer support guide 412 and the support roller 450. In one embodiment, the support pad 418 can be formed of a PPS resin, a vinyl chloride resin, a PEEK resin, or the like.

As illustrated in FIG. 5, FIG. 6, a retainer support frame 420 is fixed to the lower member 306 of the head main body 2. As illustrated in FIG. 6, the retainer support frame 420 is fixed to the lower member 306 by bolts 422. As illustrated in FIG. 5, FIG. 6, the seal packing 415 is sandwiched between the lower member 306 and the retainer support frame 420. As illustrated, the seal packing 415 extends from a region between the lower member 306 and the retainer support frame 420 and to a region between the retainer support guide 412 and the retainer guide 416. It can also be said that the seal packing 415 extends from the head main body 2 up to the retainer portion 380. Thus, the seal packing 415 can suppress the polishing liquid and the like from entering the inside of the head 302 from between the head main body 2 and the retainer portion 380.

As illustrated in FIG. 6, a shaft 424 is fixed to the retainer support frame 420. The support roller 450 is rotatably supported by the shaft 424. In one embodiment, the plurality of support rollers 450 are disposed along each side of the quadrangle ring-shaped retainer portion 380.

In the above-described embodiment, a rotation force of the head shaft 18 is transmitted to the upper member 303, the intermediate member 304, and the lower member 306.

Furthermore, the rotation force is transmitted from the retainer support frame 420 fixed to the lower member 306 to the support roller 450 and is transmitted from the support roller 450 to the retainer portion 380 through the support pad 418. Thus, the rotation force of the head main body 2 of the head 302 is transmitted to the retainer portion 380 through the support roller 450.

In the above-described embodiment, by supplying the fluid to the cylinder 406 through the passage 403 to drive the piston 410 by the diaphragm 408, the retainer member 3 can be moved in the up-down direction to be pressed against the polishing pad 352. A pressing pressure of the retainer member 3 to the polishing pad 352 can be controlled by a pressure of the fluid supplied to the cylinder 406. In the above-described embodiment, when the retainer member 3 moves in the up-down direction, it moves while being guided by the support roller 450. Thus, resistance between the support roller 450 and the support pad 418 can be reduced.

<Drying Module>

The drying module is a device for drying the substrate WF. In the substrate processing apparatus 1000 illustrated in FIG. 1, the drying module 500 dries the substrate WF cleaned at a cleaning portion of the transfer module 200 after it has been polished by the polishing module 300. As illustrated in FIG. 1, the drying module 500 is disposed downstream of the transfer module 200.

The drying module 500 includes the transfer rollers 202 for transferring the substrate WF. In one embodiment, the transfer rollers 202 of the drying module 500 can be constituted of a conductive polymer. The transfer rollers 202 are electrically grounded via the roller shafts 204 or the like. The purpose of this is to suppress the substrate WF from being electrically charged and damaged. In one embodiment, an ionizer (not illustrated) may be disposed to the drying module 500 for suppressing electrical charging of the substrate WF. In one embodiment, the drying module 500 may include a sensor for detecting presence/absence of the substrate WF at a predetermined position on the transfer rollers 202.

In the embodiment, the drying module 500 includes nozzles 530 for injecting gas toward the substrate WF transferred on the transfer rollers 202. The gas can be, for example, a compressed air or nitrogen. As for the nozzle 530 of the drying module 500, for example, a nozzle similar to or resembling the nozzle disclosed in Japanese Unexamined Patent Application Publication No. JP-A-2020-019115 can be utilized.

<Unload Module>

The unload module 600 is a module for unloading the substrate WF after processing such as polishing and cleaning is performed to outside of the substrate processing apparatus 1000. In the substrate processing apparatus 1000 illustrated in FIG. 1, the unload module 600 receives the substrate that has been dried by the drying module 500. As illustrated in FIG. 1, the unload module 600 is disposed downstream of the drying module 500.

In the embodiment illustrated in FIG. 1, the unload module 600 includes the plurality of transfer rollers 202 for transferring the substrate WF. By rotating the transfer rollers 202, the substrate on the transfer rollers 202 can be transferred in a predetermined direction. In one embodiment, the transfer rollers 202 of the unload module 600 can be constituted of a conductive polymer. In one embodiment, the transfer rollers 202 are electrically grounded via the roller shafts 204 and the like. The purpose of this is to suppress the substrate WF from electrically being charged and damaged. In one embodiment, an ionizer (not illustrated) may be disposed to the unload module 600 for suppressing electrical charging of the substrate WF. In one embodiment, the unload module 600 may include a sensor for detecting presence/absence of the substrate WF at a predetermined position on the transfer rollers 202.

In the substrate processing apparatus 1000 illustrated in FIG. 1, while two of the transfer module 200 and two of the polishing module 300 are each disposed, the numbers of the transfer module 200 and the polishing module 300 may each be one or may each be three or more. As described above, the load module 100, the transfer module 200, the polishing module 300, the drying module 500, and the unload module 600 may each be constituted as an independent module.

From the above-described embodiments, at least the following technical ideas are obtained.

[Configuration 1] According to a configuration 1, a head for holding a polygonal substrate is provided. The head includes a substrate support surface, a retainer member, and a retainer guide. The substrate support surface has a shape corresponding to a shape of the polygonal substrate. The retainer member is disposed outside each side of the substrate support surface. The retainer guide is configured to support the retainer member. The retainer member has an engaging surface extending in a direction perpendicular to the substrate support surface, and the engaging surface of the retainer member engages with the retainer guide.

[Configuration 2] According to the configuration 2, in the head of the configuration 1, the retainer member and the retainer guide are fixed with one another by a bolt.

[Configuration 3] According to the configuration 3, in the head of the configuration 1 or 2, the engaging surface of the retainer member engages with an inner side surface of the retainer guide viewed from a center of the head.

[Configuration 4] According to the configuration 4, in the head of any one of the configurations 1 to 3, the retainer member includes a first layer and a second layer, and the first layer and the second layer are formed of different materials with one another.

[Configuration 5] According to the configuration 5, a retainer member to be used in a head for holding a polygonal substrate is provided. The retainer member includes a plate-shaped member and an engaging surface extending in a direction perpendicular to a plate surface. The engaging surface of the retainer member is configured to engage with a retainer guide configured to support the retainer member when the retainer member is mounted to the head.

[Configuration 6] According to the configuration 6, in the retainer member of the configuration 5, the retainer member has a bolt hole for being fixed to the retainer guide by a bolt.

[Configuration 7] According to the configuration 7, in the retainer member of the configuration 5 or 6, the plate-shaped member includes a first layer and a second layer, and the first layer and the second layer are formed of different materials with one another.

[Configuration 8] According to the configuration 8, a substrate processing apparatus that processes a polygonal substrate is provided. The substrate processing apparatus includes the head according to any one of the configurations 1 to 4 and a polishing table for supporting a polishing pad.

REFERENCE SIGNS LIST

2 . . . head main body
3 . . . retainer member
4 . . . elastic film
100 . . . load module
200 . . . transfer module
300 . . . polishing module
302 . . . head
350 . . . polishing table
352 . . . polishing pad
380 . . . retainer portion
412 . . . retainer support guide
416 . . . retainer guide
417 . . . bolt
418 . . . support pad
419 . . . bolt hole
420 . . . retainer support frame
421 . . . pin hole
423 . . . pin
425 . . . projecting portion
427 . . . engaging surface
500 . . . drying module
600 . . . unload module
900 . . . control device
100 . . . substrate processing apparatus
WF . . . substrate

The invention claimed is:

1. A head for holding a polygonal substrate, comprising:
a substrate support surface having a shape corresponding to a shape of the polygonal substrate;
a retainer member disposed outside each side of the substrate support surface; and
a retainer guide configured to support the retainer member, wherein the retainer member and the retainer guide are fixed with one another by a plurality of bolts,
the retainer member has an engaging surface extending in a direction perpendicular to the substrate support surface, and
the engaging surface of the retainer member engages with the retainer guide,
the engaging surface of the retainer member is disposed at an inner side of the bolt viewed from a center of the head,
the retainer member includes a projecting portion projecting in a direction toward an inner side surface of the retainer guide, the projecting portion defining the engaging surface,
the projection portion and the engaging surface of the retainer member are disposed up to an end of the retainer member with respect to the bolt located at the farthest end.

2. The head according to claim 1, wherein
the engaging surface of the retainer member engages with an inner side surface of the retainer guide viewed from the center of the head.

3. The head according to claim 1, wherein
the retainer member includes a first layer and a second layer, and
the first layer and the second layer are formed of different materials with one another.

4. A substrate processing apparatus that processes a polygonal substrate, comprising:
the head according to claim 1; and
a polishing table for supporting a polishing pad.

5. A retainer member to be used in a head for holding a polygonal substrate, comprising:
a plate-shaped member; and
an engaging surface extending in a direction perpendicular to a plate surface, wherein
the engaging surface of the retainer member is configured to engage with a retainer guide configured to support the retainer member when the retainer member is mounted to the head,
the retainer member has a plurality of bolt holes for being fixed to the retainer guide by a plurality of bolts,
the engaging surface of the retainer member is disposed at an inner side of the bolt viewed from a center of the head,
the retainer member includes a projecting portion projecting in a direction toward an inner side surface of the retainer guide, the projecting portion defining the engaging surface,
the projection portion and the engaging surface of the retainer member are disposed up to an end of the retainer member with respect to the bolt hole located at the farthest end.

6. The retainer member according to claim 5, wherein
the plate-shaped member includes a first layer and a second layer, and
the first layer and the second layer are formed of different materials with one another.

7. A head for holding a polygonal substrate, comprising:
a substrate support surface having a shape corresponding to a shape of the polygonal substrate;
a retainer member disposed outside each side of the substrate support surface; and
a retainer guide configured to support the retainer member, wherein the retainer member and the retainer guide are fixed with one another by a plurality of bolts,
the retainer member has an engaging surface extending in a direction perpendicular to the substrate support surface, and
the engaging surface of the retainer member engages with the retainer guide,
the engaging surface of the retainer member is disposed at an inner side of the bolt viewed from a center of the head,
the retainer member includes a projecting portion projecting in a direction toward an inner side surface of the retainer guide, the projecting portion including the engaging surface.

8. The retainer member according to claim 7, wherein the projection portion and the engaging surface of the retainer member are disposed up to an end of the retainer member with respect to the bolt located at the farthest end.

* * * * *